United States Patent

Yoshida et al.

[11] Patent Number: 6,118,708
[45] Date of Patent: Sep. 12, 2000

[54] SEMICONDUCTOR MEMORY DEVICE

[75] Inventors: Katsuya Yoshida, Kawasaki; Tamiji Akita, Sapporo; Kenji Ijitsu, Kawasaki, all of Japan

[73] Assignee: Fujitsu Limited, Kawasaki, Japan

[21] Appl. No.: 09/208,975

[22] Filed: Dec. 11, 1998

[30] Foreign Application Priority Data

May 14, 1998 [JP] Japan ................... 10-132419

[51] Int. Cl.⁷ ................ G11C 7/00; G11C 7/02
[52] U.S. Cl. .......................... 365/190; 365/207
[58] Field of Search .................. 365/154, 156, 365/190, 205, 207, 208

[56] References Cited

U.S. PATENT DOCUMENTS

| | | | |
|---|---|---|---|
| 4,764,899 | 8/1988 | Lewallen et al. | 365/190 |
| 5,325,338 | 6/1994 | Runaldue et al. | 365/156 |
| 5,966,317 | 10/1999 | O'Connor | 365/154 |
| 5,973,985 | 10/1999 | Ferrant | 365/156 |

FOREIGN PATENT DOCUMENTS 62-63465 3/1987 Japan.
4-252494 9/1992 Japan.
8-125130 5/1996 Japan.

Primary Examiner—Trong Q. Phan
Attorney, Agent, or Firm—Armstrong, Westerman, Hattori, McLeland & Naughton

[57] ABSTRACT

The present invention concerns a memory structure wherein a plurality of memory cells such as SRAM are provided in columns and a plurality of bit line pairs are provided for each column. A write circuit drives a first bit line pair and writes data to the memory cells in the column; at the same time, a sense amp reads data by means of the second bit line pair. In that case, the first bit line pair and second bit line pair, provided in the same column, are driven with opposite phase signals. To prevent the reversal of the small potential difference of the second bit line pair for reading at that time, two bit lines, one bit line from the first and second bit line pairs, are arranged parallel in a first wiring layer and are interspersed with a fixed potential wiring. Furthermore, the two other bit lines from the first and second bit line pairs, are arranged parallel in a second wiring layer provided via an insulating layer and are interspersed with a fixed potential wiring. With such a structure, the first bit line pair and second bit line pair are disposed in each wiring layer and interposed in the fixed potential wiring; therefore, crosstalk therebetween is prevented even when the bit line pairs are driven with opposite phase signals and erroneous read operations are prevented.

15 Claims, 11 Drawing Sheets

DETAILED CIRCUIT OF FIG. 1

FIRST EMBODIMENT

FIRST EMBODIMENT

OPERATION OF EMBODIMENT

SECOND EMBODIMENT

THIRD EMBODIMENT

OPEARATION OF PRIOR ART

SEMICONDUCTOR MEMORY DEVICE

BACKGROUND OF THE INVENTION

1. Field of the Invention

The present invention relates to a semiconductor memory device, and more particularly to a new structure for a semiconductor memory device, wherein two or more groups of bit line pairs are disposed for memory cells arranged in columns, wherein the bit line pairs are prevented from operating in error as a result of noise.

2. Description of the Related Art

Semiconductor memory device, which randomly access SRAM or DRAM and read or write data at high speeds, are used as memory in computers requiring high speed cache memory. Also, SRAM or the like are formed in system LSI chips which constitute microprocessors.

Dual port RAM was developed in order to realize high speeds. In dual port RAM, two groups of bit line pairs are established for each of the memory cells arranged in columns. This memory has a first bit line pair for carrying out reading and writing, for example, and also a second bit line pair which can carry out reading. While reading with one bit line pair, the memory can use the other bit line pair for writing. Or, while reading data in a memory cell by means of one bit line pair, the memory can read data in another memory cell using the other bit line air.

FIG. 9 is a diagram of a conventional semiconductor memory apparatus. In the semiconductor memory apparatus shown in FIG. 9, only one memory cell MC is shown for purposes of convenience, but usually a plurality of memory cells MC is arranged in columns and words. Two bit line pairs, BLA, XBLA and BLB, XBLB, are arranged in columns. The bit line XBLA forms one pair with the bit line BLA and has a signal which is the reverse of the bit line BLA. Also, two word lines WLA and WLB are disposed in words. When the word line WLA is selected, the bit line pair BLA, XBLA is connected to the memory cell MC; when the word line WLB is selected, the bit line pair BLB, XBLB is connected to the memory cell MC.

The bit line pair BLA, XBLA is connected to the data bus line pair DBA, XDBA by means of the column selection circuit CLSA. A write amp WA and sense amp SAA are established on the data bus line pair DBA, XDBA and connected to the output buffer OBA. Also, the bit line pair BLB, XBLB is connected to the data bus line pair DBB, XDBB by means of the column selection circuit CLSB. A sense amp SAB is established on the data bus line pair DBB, XDBB and connected to the output buffer OBB.

In this way, the dual port structure, having two groups of bit line pairs and data bus line pairs connected thereto, makes possible the following, for example. While data are written from one data bus line pair DBA, XDBA by means of the first bit line pair BLA, XBLA, data can be read from the second bit line pair BLB, XBLB by means of the second data bus line pair DBB, XDBB. Furthermore, it is also possible to read two memory cells at the same time using both bit line pairs.

In data reading, the bit line pair and data bus line pair are driven by the memory cell MC; small potential difference generated by the data bus line pair is detected and amplified by the sense amp. Meanwhile, in data writing, the writing amp drives the data bus line pair and bit line pair and forces a reversal of the memory cell state. In order to have a high capacity memory, the memory cell driving power is kept to a minimum, while the driving power of the writing amp is made greater than that of the memory cell.

A further increase of the number of bit line pairs can make the aforementioned dual port RAM into multi-port RAM structure with three or more ports.

However, because the aforementioned dual port RAM has the two groups of bit line pairs juxtaposed in columns, the signal of one bit line pair influences the other bit line pair by means of parasitic capacity C0, C1. Increased capacity of memory results in longer bit line pairs and the aforementioned parasitic capacity becomes large as well. Consequently, crosstalk between the bit line pairs increases.

The following problem may result especially when a read operation is performed using the second bit line pair BLB, XBLB. When the write operation is carried out with the first bit line pair BLA, XBLA to another memory in the same column, the change in the potential of the first bit line pair BLA, XBLA, which is driven with a large amplitude, is transferred by means of the parasitic capacity to the second bit line pair BLB, XBLB, which is driven with a small amplitude. This can cause errors in the read operation carried out with the second bit line pair.

FIG. 10 is a cross sectional view showing an example of the signal wiring layer for the two groups of bit line pairs. The bit lines BLA and BLB, disposed on the left side of the memory cell MC, are coupled by means of the parasitic capacity C1. Likewise, the bit lines XBLA and XBLB, disposed on the right side of the memory cell MC, are coupled by means of the parasitic capacity C0. In that case, the second bit line pair BLB, XBLB, which is engaged in the read operation, is driven at the high, low level by the memory cell MC, while the first bit line pair BLA, XBLA, which is engaged in the write operation, is driven at the low, high level by the write amp WA. Whereupon, the low, high level of the first bit line pair BLA, XBLA, which is driven at a greater amplitude, is transferred to the second bit line pair BLB, XBLB by means of the parasitic capacitors C0, C1. Then, the level of the second bit line pair BLB, XBLB, which is driven at a lower amplitude, is sometimes put in the reverse state.

FIG. 11 is an example of a signal waveform diagram showing the operation of the Prior art. In FIG. 11, the preset signal PRA, PRB, not shown in FIG. 9, reach the high level so that the bit line pairs and data bus line pairs are all preset to the high level. Afterwards, the column selection signals CLA, CLB rise to the high level and the bit line pairs are connected to the respective data bus line pairs. Then, the word lines WLA, WLB each rise temporarily and different memory cells in the same column are selected.

The second bit line pair BLB, XBLB and second data bus line pair DBB, XDBB, which are carrying out reading, are driven by the memory cell MC and, as shown, have a slight potential difference $\Delta V$. The signal NSAB, which drives the second sense amp SAB, rises, whereupon the second bit line pair BLB, XBLB and second data bus line pair DBB, XDBB are driven greater and become high level and low level. Meanwhile, the first data bus line pair DBA, XDBA and the first bit line pair BLA, XBLA are driven by the write amp WA; in this example, one bit line BLA is driven greater at the low level. In response to this driving, the second bit line BLB coupled with the parasitic capacity C1 is also driven toward the low level side; in the worst case, the High and Low levels become reversed between the second bit line pair BLB, XBLB. Such a reversal results in the sense amp SAB outputting data which was read in error. The aforementioned erroneous read operation sometimes occurs in the same way when reading a different memory cell in the same column.

Japanese Patent Laid-open Publication No. 4-252494 is a known example which makes note of reducing crosstalk among a plurality of pairs of data bus lines. However, this patent does not indicate the problems with memory having the aforementioned plurality of bit line pairs established for one column.

SUMMARY OF THE INVENTION

It is an object of the present invention to provide a semiconductor memory device which is a memory having a plurality of bit line pairs for each column, wherein erroneous read operations due to crosstalk among bit line pairs are prevented.

It is another object of the present invention to provide a semiconductor memory device which is dual port SRAM, wherein errors in read operations, performed at the same time as reading and writing, are prevented.

It is another object of the present invention to provide a semiconductor memory device having a new structure which minimizes the influence of crosstalk when a plurality of complementary signal line pairs are juxtaposed.

In order to achieve the aforementioned objects, the present invention concerns a memory structure wherein a plurality of memory cells such as SRAM are provided in columns and a plurality of bit line pairs are provided for each column. A write circuit drives a first bit line pair and writes data to the memory cells in the column; at the same time, a sense amp reads data by means of the second bit line pair. In that case, the first bit line pair and second bit line pair, provided in the same column, are driven with opposite phase signals. To prevent the reversal of the small potential difference of the second bit line pair for reading at that time, two bit lines, one bit line from the first and second bit line pairs, are arranged parallel in a first wiring layer and are interspersed with a fixed potential wiring. Furthermore, the two other bit lines from the first and second bit line pairs, are arranged parallel in a second wiring layer provided via an insulating layer and are interspersed with a fixed potential wiring.

With such a structure, the first bit line pair and second bit line pair are disposed in each wiring layer and interposed in the fixed potential wiring; therefore, crosstalk therebetween is prevented even when the bit line pairs are driven with opposite phase signals and erroneous read operations are prevented.

In another example of an arrangement of bit line pairs for preventing erroneous operations, two bit lines, one bit line of the first and second bit line pairs, are arranged parallel to each other at both ends of the memory cell region in the first wiring layer. Furthermore, two other bit lines, the other bit lines of the first and second bit line pairs, are arranged parallel to each other at both ends of the memory cell region of a second wiring layer provided via an insulating layer. In this manner, the first and second bit lines, for which the effects of crosstalk therebetween are a concern, are separated at both ends of the memory cell region. The parasitic capacity between the bit lines is thereby reduced sufficiently and the influence of crosstalk can be eliminated. In order to arrange the bit lines in two pairs, the bit line pairs are arranged in a two-layered wiring structure.

Furthermore, in another example of an arrangement of bit line pairs for preventing erroneous operations, the first bit line pair is arranged in the first wiring layer with the bit lines parallel to each other and the second bit line pair is arranged in the second wiring layer with the bit lines parallel to each other. A third wiring layer, having fixed potential wiring interposed between the first and second bit line pairs, is provided between the first and second wiring layers.

Furthermore, in another example of an arrangement, one pair of bit lines, either the first or second bit line pair, are arranged to be parallel and the other pair of bit lines are arranged to be parallel but intersect at prescribed distances or intervals. In any of the aforementioned arrangements, both crosstalk and erroneous read operations are prevented, even if the two groups of bit line pairs are driven with opposite phase signals.

In order to achieve the above objects, the present invention is a semiconductor memory device, where first and second bit line pairs are established for each column where a plurality of memory cells are arranged, comprising a write circuit driving said first bit line pair when writing data to said memory cell, and a sense amp for detecting the potential difference of said second bit line pair when reading data from said memory cell; and further comprising:

a first wiring layer wherein one bit lines from each of said first and second bit line pairs are parallel and interspersed with a fixed potential wiring; and a second wiring layer provided over said first wiring layer with an insulating layer therebetween and wherein another bit lines from each of said first and second bit line pairs are parallel and interspersed with a fixed potential wiring;

wherein said one lines and another bit lines of said first and second bit line pairs are disposed at mutually opposite positions with said insulating layer therebetween.

The aforementioned invention suppresses crosstalk between the first and second bit line pairs to minimal levels because of the layer with fixed potential wiring interposed between the first bit line pair and the second bit line pair.

In order to achieve the aforementioned objects, the present invention is a semiconductor memory device, wherein first and second bit line pairs are provided for each of the columns where a plurality of memory cells are arranged, comprising a write circuit driving the first bit line pair when writing data to the memory cell, and a sense amp for detecting the potential difference of the second bit line pair when reading data from the memory cell; the semiconductor memory device comprising:

a first wiring layer wherein one bit lines from each of the first and second bit line pairs are parallel at both ends of a memory cell region where the memory cells are formed; and a second wiring layer, provide over the first wiring layer with an insulating layer therebetween, wherein another bit lines from each of the first and second bit line pairs are parallel at both ends of the memory cell region;

wherein the one bit lines and another bit lines of the first and second bit line pairs are disclosed at mutually opposite positions with the insulating layer therebetween.

The invention can suppress crosstalk between the first and second bit line pairs because the one bit lines and another bit lines of the first and second bit line pairs are positioned at both ends of the memory cell region.

Furthermore, in order to achieve the aforementioned objects, the present invention is a semiconductor memory device wherein first and second bit line pairs are provided for each of the columns where a plurality of memory cells are arranged, and comprising a write circuit driving the first bit line pair when writing data to the memory cell, and a sense amp for detecting the potential difference of the second bit line pair when reading data from the memory cell; the semiconductor memory device comprises:

a first wiring layer wherein the bit lines of the first bit line pair are parallel;

a second wiring layer, provided over the aforementioned first wiring layer via an insulating layer, wherein the bit lines of the second bit line pair are parallel; and a third wiring layer, provided between the first and second wiring layers, including fixed potential wiring between the first and second bit line pairs.

The aforementioned invention suppresses crosstalk between the first and second bit line pairs to minimal levels because of the layer with fixed potential wiring interposed between the first bit line pair and second bit line pair.

Furthermore, in order to achieve the objects, the present invention is a semiconductor memory device wherein first and second bit line pairs are provided for each of the columns where a plurality of memory cells are arranged, and comprising a write circuit driving the first bit line pair when writing data to the memory cells, and a sense amp for detecting the potential difference of the aforementioned second bit line pair when reading data from the memory cell; wherein the bit lines of said first or second bit line pair are arranged to be parallel; the bit lines of the second or first bit line pair are arranged to be parallel and intersect at prescribed distances or intervals.

The aforementioned invention prevents erroneous reading caused by crosstalk, because the crosstalk between the first and second bit line pairs is offset.

DESCRIPTION OF THE PREFERRED EMBODIMENTS

The preferred embodiments are explained below with reference to the figures. However, the technical scope of the present invention is not limited to these embodiments.

Figure 1:
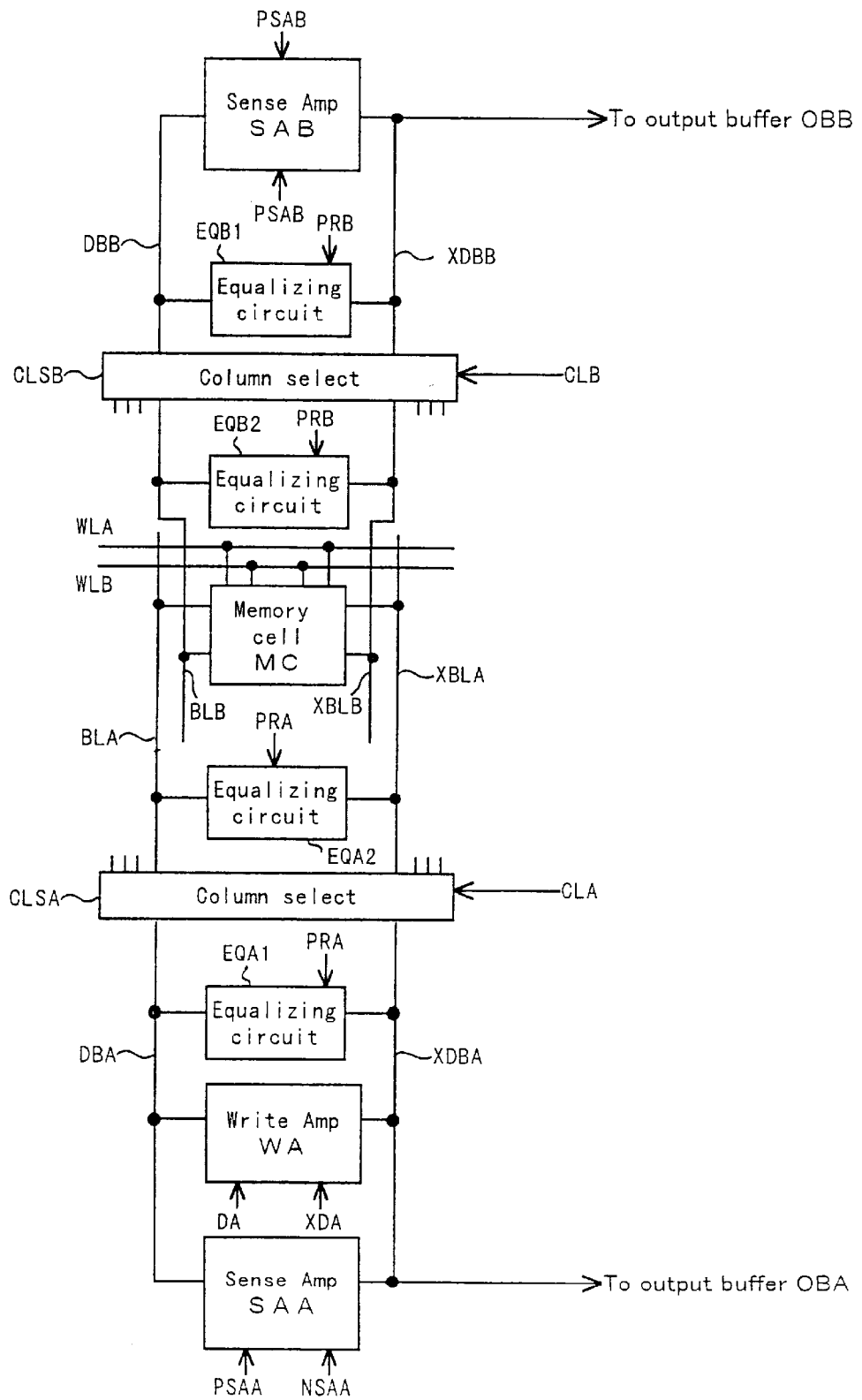
FIG. 1 is a diagram of the semiconductor memory device relating to an embodiment of the present invention.

FIG. 1 is a diagram of a semiconductor memory device relating to an embodiment of the present invention. The example in FIG. 1 has one memory cell MC. However, an usual semiconductor memory device has a plurality of memory cells arranged in a matrix unlike FIG. 1. In the dual port RAM shown in FIG. 1, a first bit line pair BLA, XBLA and a second bit line pair BLB, XBLB are provided for the memory cell MC in the column and are each connected to the memory cell MC. Equalizing circuits EQA2, EQB2 are provided for the first and second bit line pairs; the equalizing circuits each respond to the preset signals PRA, PRB and keep the potential of the bit line pairs the same.

The first bit line pair BLA, XBLA provided in the column are connected by means of a column selection circuit (column gate) CLSA to the first data bus line pair DBA, XDBA, whereon the write amp WA, which comprise the write circuit, and sense amp SAA are provided. Consequently, the first bit line pair of the column selected by the first column selection signal CLA are connected to the first data bus line pair DBA, XDBA. The sense amp is connected to a first output buffer OBA, not shown. An equalizing circuit EQAL is provided for the first data bus line pair DBA, XDBA. This equalizing circuit responds to the preset signal PRA and resets the first data bus line pair DBA, XDBA to the same potential.

Likewise, the second bit line pair BLB, XBLB established in the column are connected by means of a column selection circuit CLSB to a second data bus line pair DBB, XDBB, whereon the sense amp SAB for reading is established. The second bit line pair of the column selected by the second column selection signal CLB are connected to the second data bus line pair DBB, XDBB. The sense amp SAB is connected to a second output buffer OBB, not shown.

Figure 2:
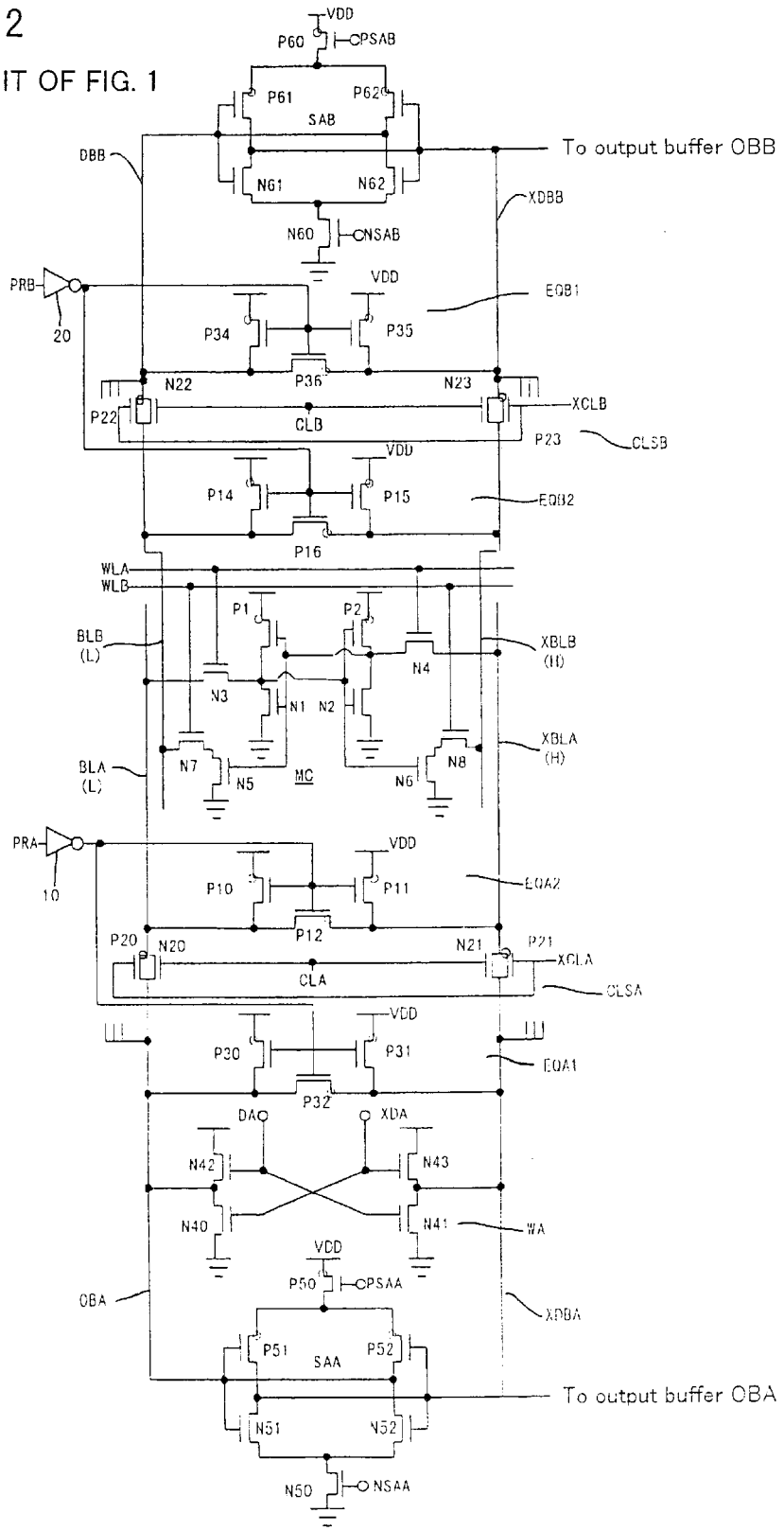
FIG. 2 is a detailed circuit diagram of FIG. 1.

FIG. 2 is a detailed circuit diagram of FIG. 1. The memory cell MC has a cross coupled structure of two CMOS comprising P channel transistors P1, P2 and N channel transistors N1, N2. Also, the N channel transistors N5, N6 are connected parallel to N1 and N2. The memory cell MC comprises transistors N3, N4 connected to the first bit line pair BLA, XBLA and transistors N7, N8 connected to the second bit line pair BLB, XBLB. The transistors N3, N4 become conductive when the word line WLA becomes high level; the transistors N7, N8 becomes conductive when the word line WLB becomes high level.

The equalizing circuits are all identical circuits. For example, the equalizing circuit EQA1 comprises P channel transistors P30, P31, P32. In response to the first preset signal PRA becoming high level, these transistors become conductive and drive the first data bus line pair DBA, XDBA at the source voltage VDD level.

The column selection circuits CLSA, CLSB are both constituted of CMOS transfer gates P20, N20, P21, N21 and P22, N22, P23, N23. The column selection circuits become conductive when each column selection signal CLA, CLB become high level; the first and second bit line pairs of the corresponding column are connected to the first and second data bus line pairs, respectively.

The first sense amp SAA connected to the first data bus line pair DBA, XDBA is constituted of P channel transistors P50, P51, P52 and N channel transistors N50, N51, N52; the inputs and outputs thereof are cross-coupled each other. When the activation signal PSAA of the sense amp is driven at low level and the activation signal NSAA is driven at high level, the sense amp detects a small potential difference between the data bus line pair DBA, XDBA and drives the data bus line pair at high level and low level respectively. The second sense amp SAB connected to the second data bus line pair DBB, XDBB has the same constitution and is driven in the same manner with the sense amp activation signals PSAB, NSAB.

The write amp WA, which is a write circuit, is established on the first data bus line pair DBA, XDBA. The write amp WA comprises N channel transistors N40, N41, N42, N43, which allow current to flow as controlled by the reverse phase data signals DA, XDA, which match external write data; and the write amp drives the first data bus line pair DBA, XDBA.

Figure 3:
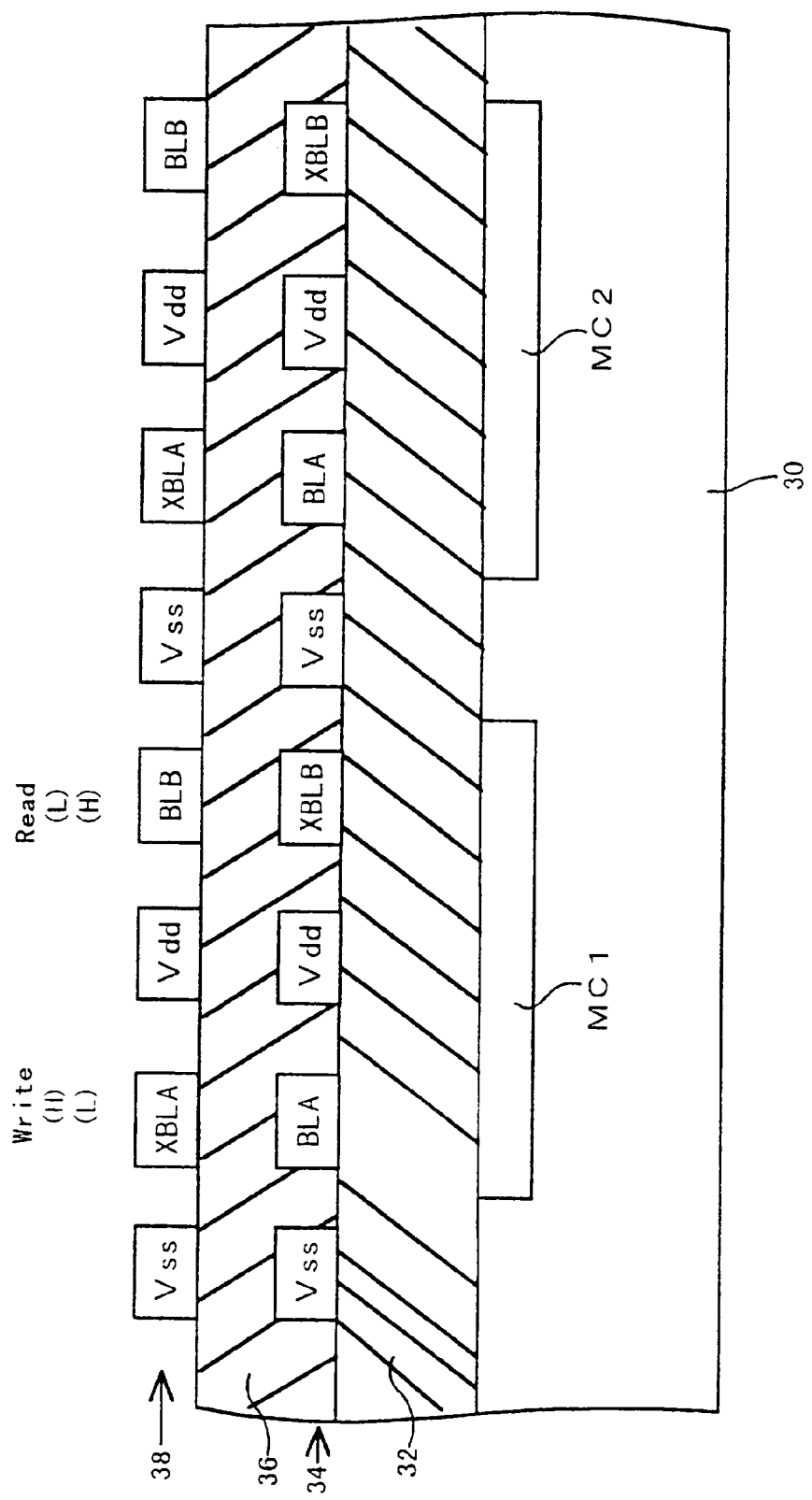
FIG. 3 is a cross sectional view of a bit line pair in the first embodiment.

FIG. 3 is a cross sectional view of a bit line pair in the first embodiment. In the example in FIG. 3, the eight transistors which comprise the memory cell MC are formed on the surface of a semiconductor substrate 30. In the example in FIG. 3, two memory cells MC1 and MC2 are formed. One bit line BLA from the first bit line pair and one bit line XBLB from the second bit line pair are arranged interspersed with ground wiring Vss and power source wiring Vdd, which both have fixed potential, on a first wiring layer 34, formed on a first insulating layer 32. Furthermore, the other bit line XBLA from the first bit line pair and the other bit line BLB from the second bit line pair are arranged in the same manner, with ground wiring Vss and source wiring Vdd interspersed therebetween, on a second wiring layer 38, formed on the second insulating layer 36. The arrangement is such that the one bit lines BLA and XBLB of the first and second bit line pairs are located opposite from the other bit lines XBLA and BLB. In such a structure, the first bit line pair BLA, XBLA and the second bit line pair BLB, XBLB are separated with the insulating layers 34, 38 and by the power source wirings Vdd, Vss having fixed potential. As a result, crosstalk between the first and second bit line pairs is prevented.

Figure 4:
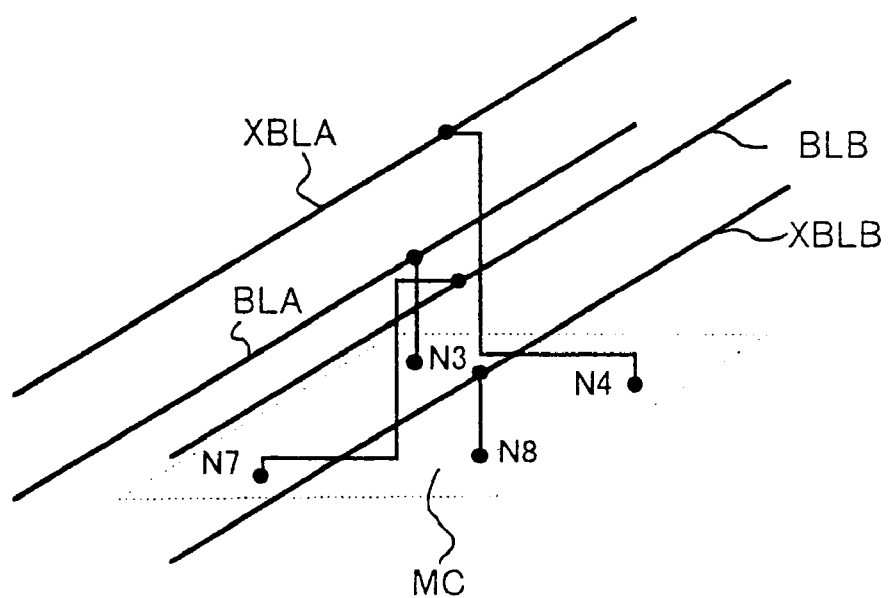
FIG. 4 is a perspective view showing the relative positions of the bit line pair in FIG. 3.

FIG. 4 is a perspective view showing the relative positions of the bit line pairs in FIG. 3. The first and second bit line pairs BLA, XBLA, BLB, XBLB are shown three-dimensionally in relation to the region of the memory cell MC formed on the surface of the semiconductor substrate 30. As shown in FIG. 4, the gate transistors N3, N4 of the memory cell MC are connected to the first bit line pair BLA, XBLA, respectively. The gate transistors N7 and N8 of the memory cell MC are connected to the second bit line pair BLB, XBLB, respectively. In the example in FIG. 4, the bit lines BLA, BLB, connected to the gate transistors N3, N7 on the left side of the memory cell MC, are not both located on the left side of the memory cell MC. Likewise, the bit lines XBLA, XBLB, connected to the gate transistors N4, N8 on the right side of the memory cell MC, are not both located on the right side of the memory cell MC.

Figure 5:
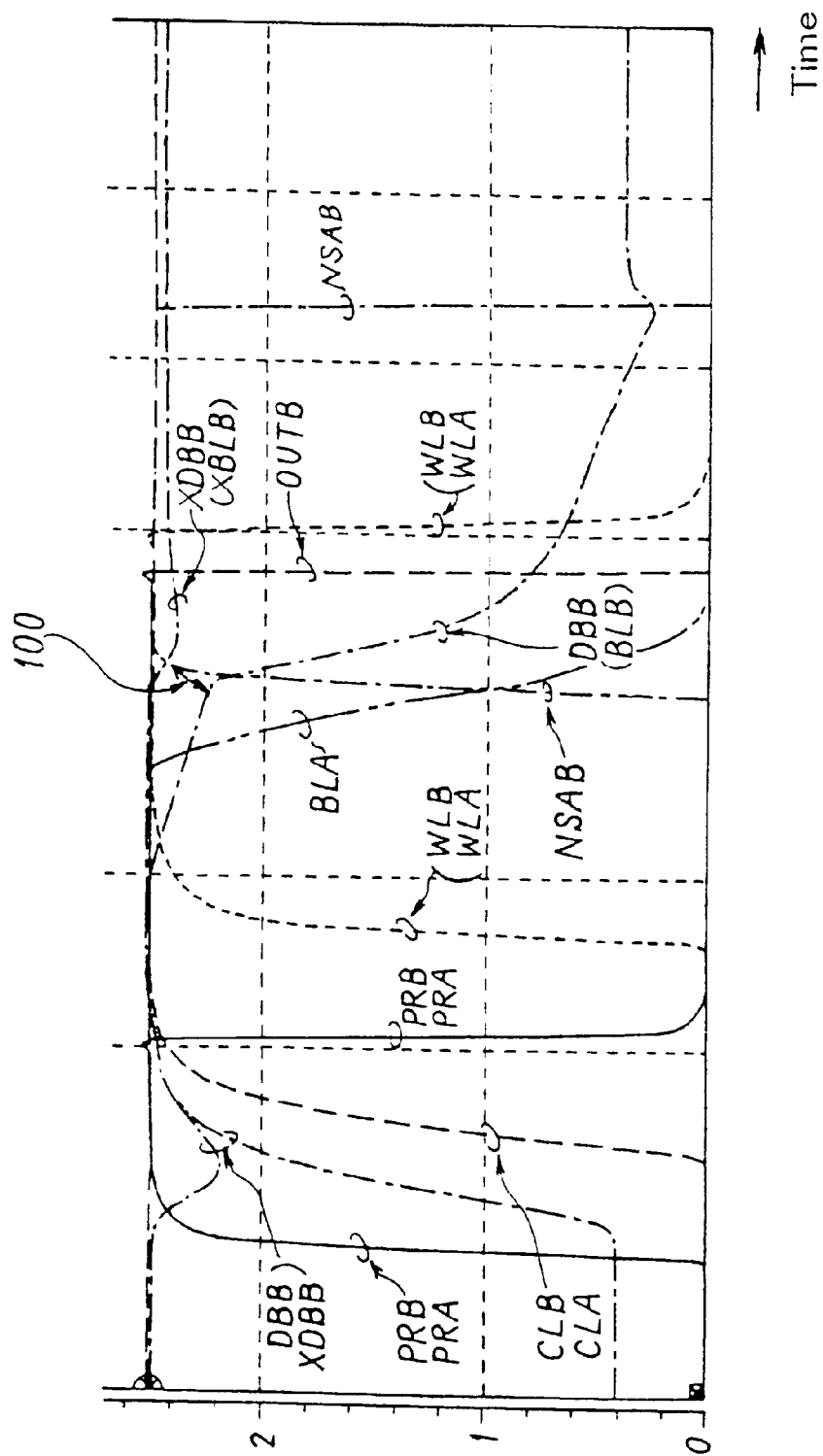
FIG. 5 is a signal waveform diagram showing the operation of the first embodiment.

FIG. 5 is a signal waveform diagram showing the operation of the first embodiment. The operation wherein data are written by means of the first bit line pair BLA, XBLA, at the same time that data in a different memory cell in the same column are read by means of the second bit line pair BLB, XBLB, is explained with reference to FIG. 1 and 2 and FIG. 5. The read and written data are shown with mutually opposite phase signals.

The preset signals PRA, PRB become high level; each equalizing circuit EQA1, 2, EQB1, 2 drives the data bus line pairs and bit line pairs at high level. Thereafter, the column selection signals CLA, CLB both become high level; the corresponding column selection circuits CLSA, CLSB become conductive; and the first and second bit line pairs are connected to the first and second data bus line pairs, respectively. In this example, the first and second bit line pairs selected are disposed within the same column.

When the preset signals PRA, PRB return to low level, the word lines WLA, WLB are driven at high level. In this example, the driven word lines WLA, WLB are word lines arranged in different rows. A rise in word line WLB results in the transistors N7, N8 of the corresponding memory cell MC become conductive. Either of the second bit line pair BLB, XBLB is driven at low level by transistor N5 or N6.

Here, one bit line BLB and data bus line DBB are driven at low level by the transistor N5; the other bit line XBLB and data bus line XDBB are maintained at high level. The small potential difference generated by this second bit line pair BLB, XBLB and second data bus line pair DBB, XDBB is detected by the sense amp SAB; the second bit line pair and second data bus line pair are driven so that it becomes a greater potential difference. More specifically, the low level side bit line BLB, DBB are driven at the ground level.

Meanwhile, the write amp WA supplies the write data signal DA at low level and the write data signal XDA at high level. The transistors N40 and N43 become conductive, drive the first data bus line DBA and first bit line BLA at low level (ground level), and drive the first data bus line XDBA and first bit line XBLA at high level (power source Vdd level). The driving capacity of the transistors in the write amp is greater than that of the transistors N1, N2 and P1, P2 in the memory cell MC. Regardless of the state within the memory cell MC, the transistors in the write amp control the transistors in the memory cell MC in a state corresponding to the write data signal, by means of the first data bus line pair and first bit line pair. Moreover, the amplitude of the first bit line pair is greater than the amplitude of the second bit line pair during the read operation.

Due to the effect of the write amp WA, the transistor N40 becomes conductive and drives one bit line BLA of the first bit line pair at low level (ground level). Even in that case, this operation does not influence the high level of one bit line XBLB of the neighboring second bit line pair by means of parasitic capacity. In other words, as shown in FIG. 3, the first bit line pair BLA, XBLA and second bit line pair BLB, XBLB are disposed on the respective wiring layers 34, 38 and interspersed with the fixed potential power source wiring Vdd and ground wiring Vss. Accordingly, the bit line BLB, of the second bit line pair engaged in the read operation, is not driven toward the low level side, due to the low level operation of the first bit line XBLA which is driven at high amplitude by the write amp WA. As a result, as shown in 100 in the FIG. 5, the slight potential difference generated by the second bit line pair and the second data bus line pair does not become small and the second sense amp SAB does not detect erroneous data.

As shown in FIG. 5, the word lines WLA, WLB then drop and the read and write operations, which were carried out concurrently, are finished.

In the case of the dual port RAM having the structure shown in FIGS. 1 and 2, it is also possible to read different memory cells in the same column at the same time. In that case, data in the memory cell are read by each sense amp SAA, SAB via each bit line pair. In that case, crosstalk between the first and second bit line pairs does not occur and data are not read in error, even when mutually reverse data are read at the same time, and even if the first and second bit line pair are operated inversely by the driving of each sense amp.

Moreover, in the first embodiment shown in FIGS. 3 and 4, the second bit line pair BLB, XBLB is formed as follows: the bit line XBLB in the first wiring layer 34 and the bit line BLB in the second wiring layer 38. Even if the bit line BLB is formed in the first wiring layer 34 and the bit line XBLB is formed in the second wiring layer 38, however, the erroneous operation due to crosstalk between the bit lines can be prevented in the same way.

Figure 6:
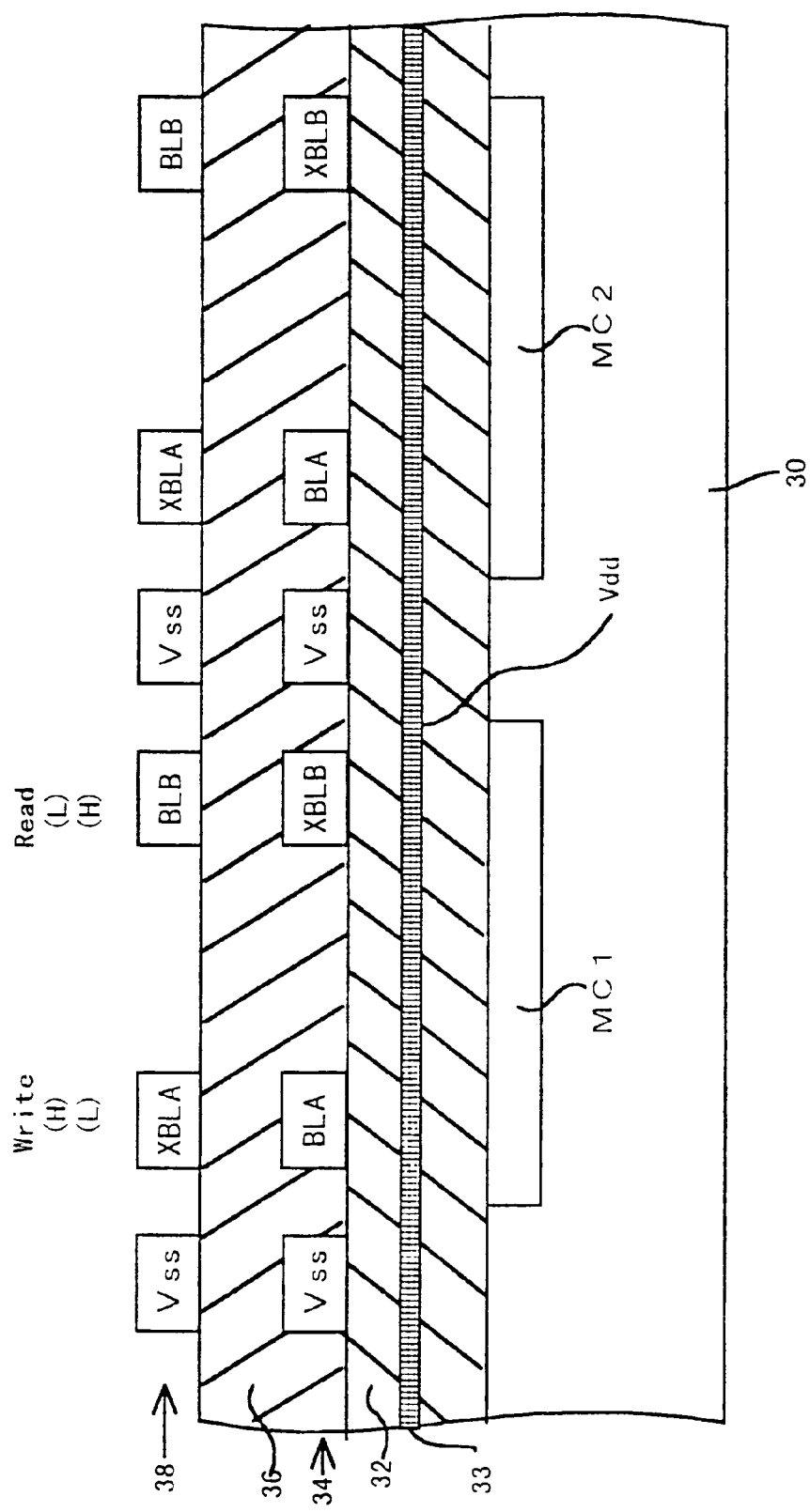
FIG. 6 is a cross sectional view of another example of the bit line pair in the first embodiment.

FIG. 6 is a cross sectional view of another example of the bit line pair in the first embodiment. This example is the same as the example in FIG. 3 in regards to one bit line, bit lines BLA and XBLB, from both the first and second bit line pair being formed in the first wiring layer 34 and the other bit line, bit lines XBLA, BLB, being formed in the second wiring layer 38. These bit line pairs are parallel at both ends of the memory cell regions MC1, MC2 and fixed potential source wiring is not disposed therebetween. In the example in FIG. 6, the power source wiring Vdd is formed in a third wiring layer 33, as allowed by the architecture. Consequently, the ground wiring Vss is formed in the first wiring layer 34 and the second wiring layer 38.

In the alternative example in FIG. 6, the one bit lines BLA, XBLB and the other bit lines XBLA, BLB, of the bit line pairs, are disposed with sufficient distance therebetween. As a result, the parasitic capacity between the bit lines is less than in the case where the two groups of bit line pairs are formed in the same wiring layer, as in the background art; erroneous operation due to crosstalk between the bit line pairs can be prevented. For the example in FIG. 6 as well, a perspective view of the connections between that wiring and the memory cell regions is the same as FIG. 4 and the operation is the same as that explained with FIG. 5. In the case of the example in FIG. 6 as well, the positions of the second bit line pair BLB, XBLB in the wiring layers 34, 38 may be reversed.

Figure 7:
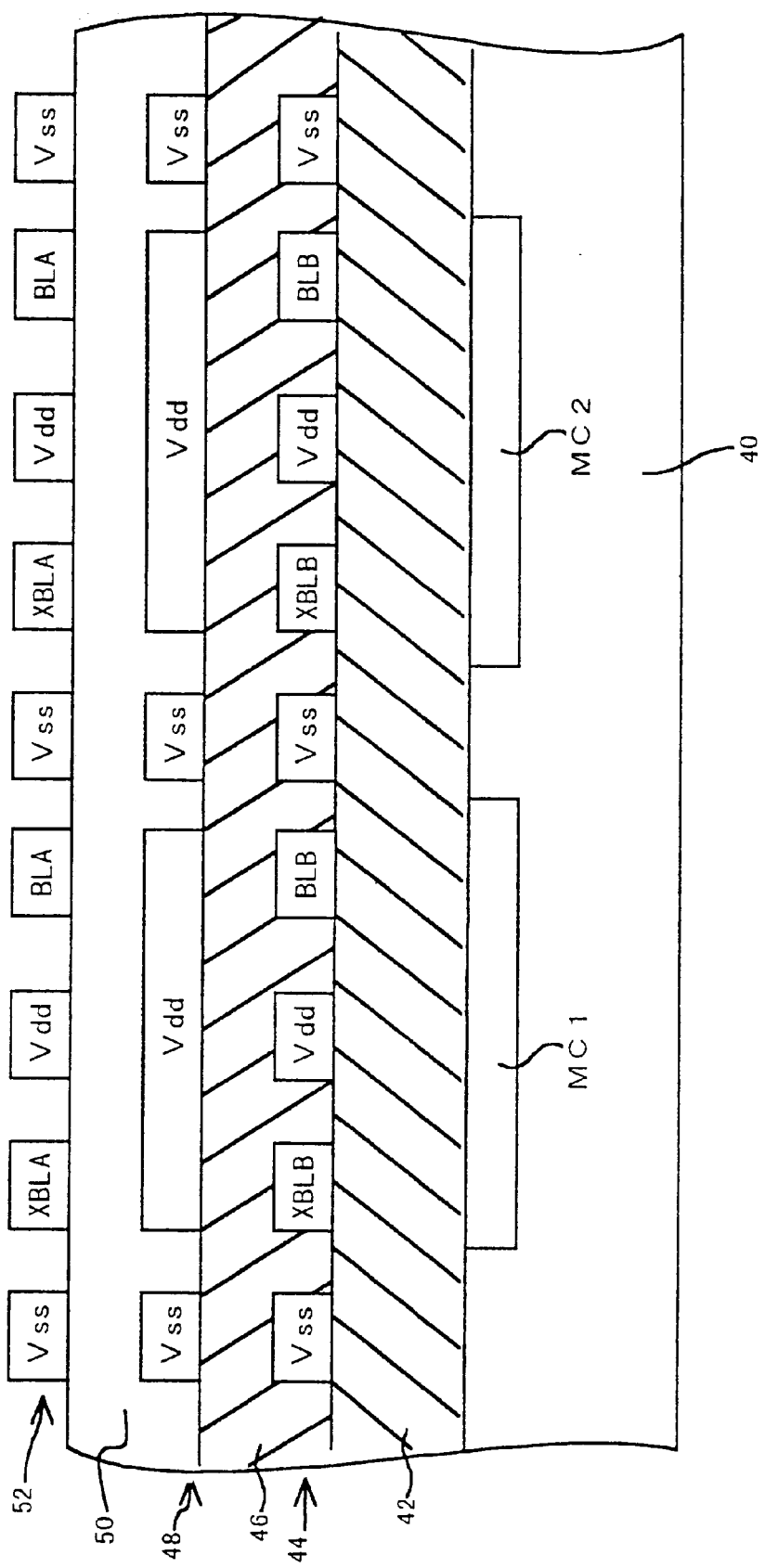
FIG. 7 is a cross sectional view of a bit line pair relating to the second embodiment.

FIG. 7 is a cross sectional view of a bit line pair relating to the second embodiment. In this example, the transistors constituting the memory cells MC1, MC2 are formed on the surface of the semiconductor substrate 40. On a first wiring layer 44 on a first insulating layer 42 formed thereon, the second bit line pair BLB, XBLB are disposed parallel to each other and interspersed with the power source wiring Vdd and the ground wiring Vss. The fixed potential source wiring Vdd and ground wiring Vss are established on the second wiring layer 48 on the second insulating layer 46 formed on the first wiring layer 44. Furthermore, the first bit line pair BLA, XBLA are disposed parallel to each other and interspersed with the power source wiring Vdd and the ground wiring Vss on the third wiring layer 52 on the third insulating layer 50 formed on the second wiring layer 48. The second bit line pair BLB, XBLB and the first bit line pair BLA, XBLA are provided on the first wiring layer 44 and third wiring layer 52 respectively; the power source wiring Vdd, having fixed potential and formed in the second wiring layer 48, is disposed therebetween. The ground wiring Vss may be so disposed instead of the source wiring Vdd.

A fixed potential wiring layer of either wiring Vdd, Vss is on the second wiring layer 48 and is disposed between the first and second bit line pairs. Crosstalk between the first and second bit line pairs is thereby kept to a minimum. Consequently, the slight potential difference read by the second bit line pair is little influenced by the change in potential of the first bit line pair, driven by the write amp WA, and erroneous read operation by the second sense amp SAB is prevented.

Figure 8:
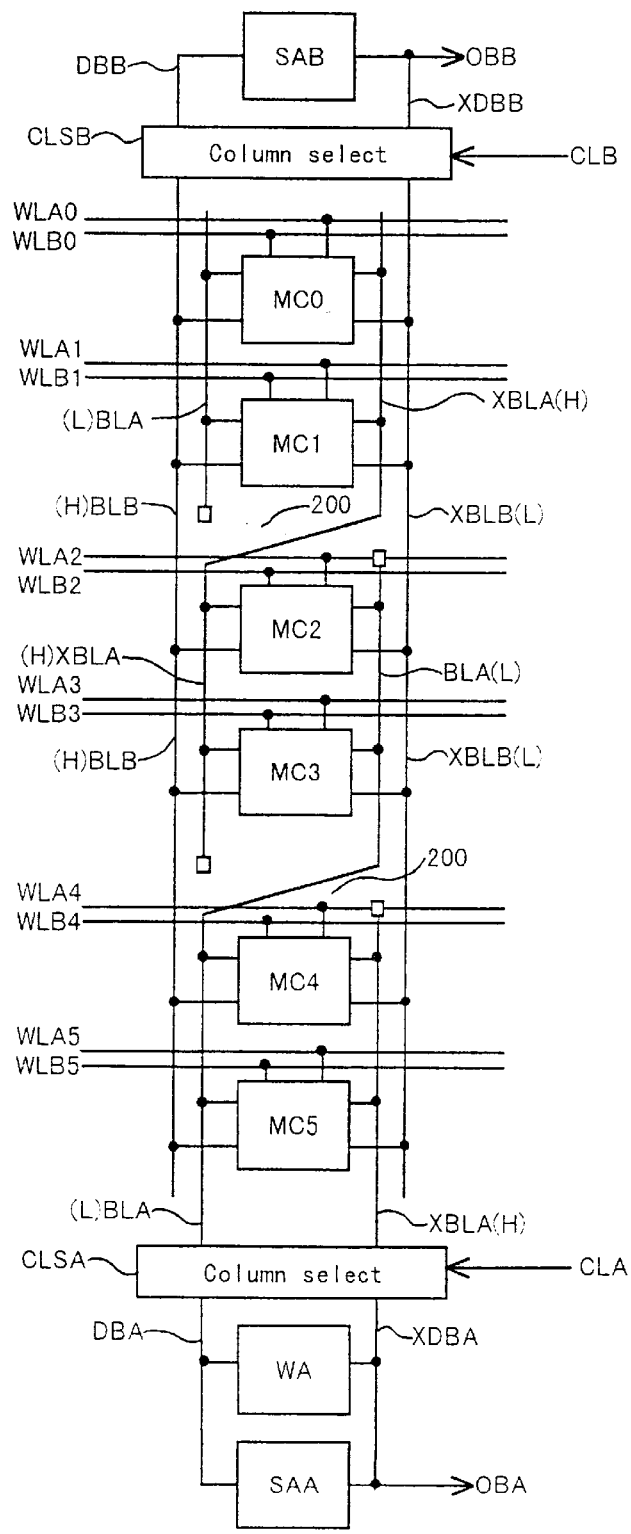
FIG. 8 is a circuit diagram showing the arrangement of the bit line pairs in the third embodiment.
Figure 9:
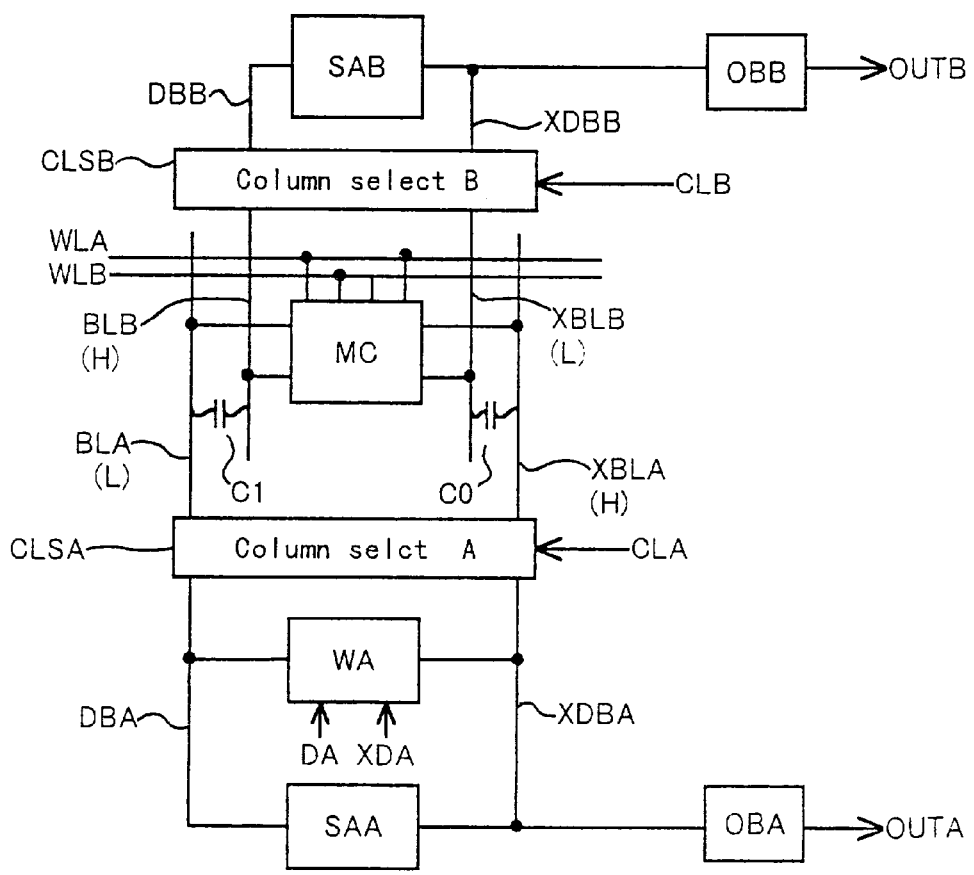
FIG. 9 is a diagram of a conventional semiconductor memory device.
Figure 10:
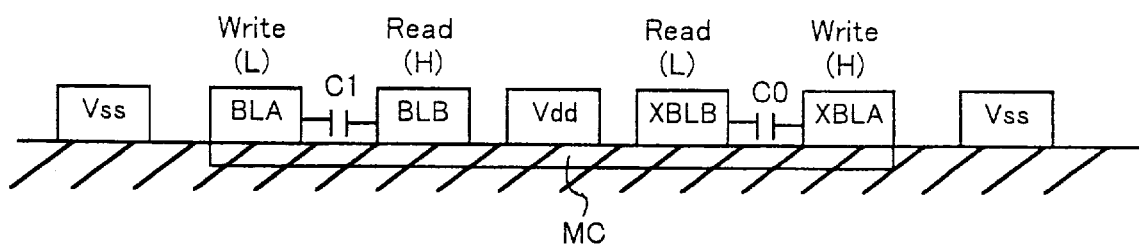
FIG. 10 is a cross sectional view showing an example of a signal wiring layer for two groups of bit line pairs.
Figure 11:
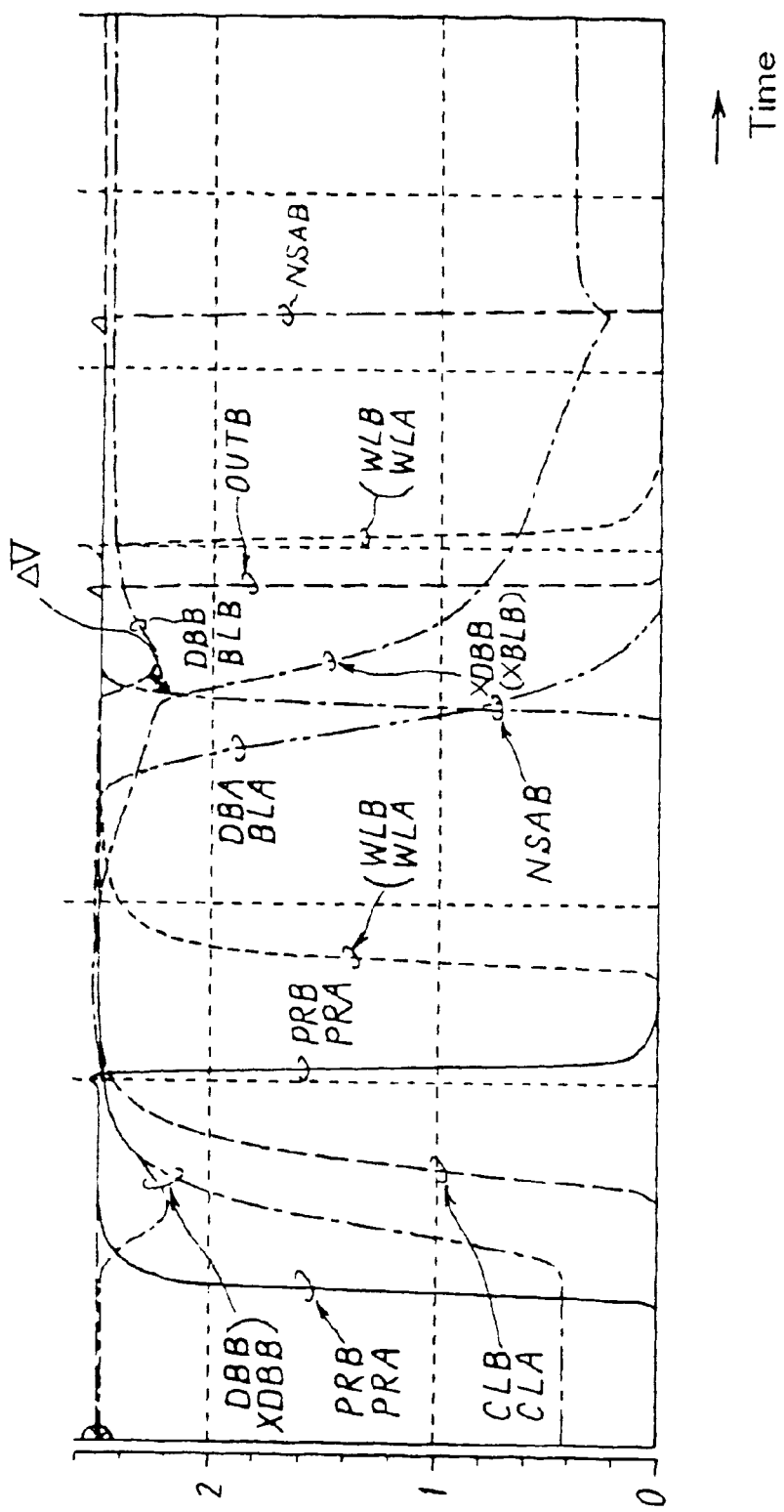
FIG. 11 is an example of a signal waveform diagram showing the operation of the background art.

FIG. 8 is a circuit diagram showing the arrangement of the bit line pairs in the third embodiment. FIG. 8 shows an example wherein six memory cells MC0–MC5 are disposed within one column. In this example, the second bit line pair BLB, XBLB are parallel. The first bit line pair BLA, XBLA are also parallel, but intersect with each other, using the upper layer wiring 200, at every second memory cell MC. For example, the first and second bit line pairs are juxtaposed on the same wiring layer.

In the third aspect of the embodiment, even if crosstalk is generated by means of the parasitic capacity between the first and second bit line pairs, the variations in the potential of each are minimized. Specifically, the read operation performed with the second bit line pair BLB, XBLB in the high level, low level state and writing is performed with the first bit line pair BLA, XBLA driven at low level, high level. In this case, the bit lines of the first bit line pair intersect crosswise at prescribed intervals, thereby offsetting crosstalk with the second bit line pair due to the driving of the first bit line pair. As a result, it is prevented that the potential of the second bit line pair is varied and erroneous reading occurs, as in the background art.

In the third aspect of the embodiment, it is clear that crosstalk is offset in the same manner, even in the case where the first bit line pair is parallel and the second bit line pair intersects at prescribed intervals. In the third embodiment, the first and second bit line pairs may be formed on the same wiring layer or on different wiring layers. Moreover, it is not necessary to intersperse fixed potential wiring between the bit line pairs, since crosstalk is offset.

The embodiments discussed above were explained using examples with two groups of bit line pairs, but the present invention is not limited to two groups of bit line pairs and can also be applied in the case of three or more groups of bit line pairs and data bus line pairs. Furthermore, the present invention can also be applied in the same way when a read amp and write amp are both formed on the plurality of groups of data bus line pairs.

As explained above, in multiport RAM wherein reading and writing can be performed at the same time to different memory cells in the same column using a plurality of bit line pairs, crosstalk therebetween can be minimized with the present invention, by interspersing fixed potential wiring such as power source wiring and ground wiring among the wiring of the bit line pairs. Especially in the case of multiport RAM where reading and writing are performed at the same time, variations of potential of a bit line pair driven at large amplitude do not influence another bit line pair driven at a slight potential difference. As a result, erroneous reading is prevented.

Furthermore, in multiport RAM which can effect reading and writing at the same time of different memory cells in the same column using a plurality of bit line pairs, crosstalk of one bit line pair to another bit line pair can be offset with the present invention by having the first bit line pair intersect at prescribed intervals. As a result, erroneous reading can be prevented.

What is claimed is:

1. A semiconductor memory device comprising:

first and second bit line pairs provided to each column where a plurality of memory cells are arranged;

a write circuit driving said first bit line pair when writing data to said memory cell;

a sense amp for detecting the potential difference of said second bit line pair when reading data from said memory cell;

a first wiring layer including first bit lines, one from each of said first and second bit line pairs disposed in parallel and separated by a fixed potential wiring; and a second wiring layer provided over said first wiring layer with an insulating layer therebetween, said second wiring layer including second bit lines, each being the other bit line from each of said first and second bit line pairs disposed in parallel and separated by a fixed potential wiring, wherein said first bit lines and said second bit lines are disposed in their respective first and second wiring layers opposite each other across said insulating layer.

2. The semiconductor memory device according to claim 1, wherein said memory cell comprises:
a latch circuit for storing data;
a first gate connected to said first bit line pair and becoming conductive by a control of a first word line; and
a second gate connected to said second bit line pair and becoming conductive by a control of a second word line.

3. The semiconductor memory device according to claim 1,
wherein said memory cell drives said second bit line pair during reading and generates a first potential difference in the second bit line pair; and
wherein said write circuit drives said first bit line pair during writing and generates a second potential difference, greater than said first potential difference, in said first bit line pair.

4. A semiconductor memory device comprising:
first and second bit line pairs provided to each column where a plurality of memory cells are arranged;
a write circuit driving said first bit line pair when writing data to said memory cell;
a sense amp for detecting the potential difference of said second bit line pair when reading data from said memory cell;
a first wiring layer including first bit lines, one from each of said first and second bit line pairs disposed in parallel respectively at ends of a memory cell region where said memory cells are formed; and
a second wiring layer, provided over said first wiring layer with an insulating layer therebetween, said second wiring layer including second bit lines, each being the other bit line from each of said first and second bit line pairs disposed in parallel respectively at ends of the memory cell region,
wherein said first bit lines and said second bit lines are disposed in their respective first and second wiring layers opposite each other across said insulating layer.

5. The semiconductor memory device according to claim 4, wherein said memory cell comprises:
a latch circuit for storing data;
a first gate connected to said first bit line pair and becoming conductive by a control of a first word line; and
a second gate connected to said second bit line pair and becoming conductive by a control of a second word line.

6. The semiconductor memory device according to claim 4,
wherein said memory cell drives said second bit line pair during reading and generates a first potential difference in the second bit line pair; and
wherein said write circuit drives said first bit line pair during writing and generates a second potential difference, greater than said first potential difference, in said first bit line pair.

7. A semiconductor memory device comprising:
first and second bit line pairs provided to each column where a plurality of memory cells are arranged;
a write circuit driving said first bit line pair when writing data to said memory cell;
a sense amp for detecting the potential difference of said second bit line pair when reading data from said memory cell;
a first wiring layer including the bit lines of said second bit line pair disposed in parallel;
a second wiring layer, provided over said first wiring layer with a first insulating layer therebetween, said second wiring layer including a fixed potential wiring disposed opposite said first bit line pair across said first insulating layer; and
a third wiring layer, provided over said second wiring layer with a second insulating layer therebetween, said third wiring layer including the bit lines of said first bit line pair disposed in parallel and opposite said fixed potential wiring across said second insulating layer.

8. The semiconductor memory device according to claim 7,
wherein said first wiring layer further includes a fixed potential wiring disposed between the bit lines of said first bit line pair; and
wherein said third wiring layer further includes a fixed potential wiring disposed between the bit lines of said second bit line pair.

9. The semiconductor memory device according to claim 7 or 8, wherein said memory cell comprises:
a latch circuit for storing data; a first gate connected to said first bit line pair and becoming conductive by a control of a first word line; and
a second gate connected to said second bit line pair and becoming conductive by a control of a second word line.

10. The semiconductor memory device according to claim 7 or 8,
wherein said memory cell drives said second bit line pair during reading and generates a first potential difference in the second bit line pair; and
wherein said write circuit drives said first bit line pair during writing and generates a second potential difference, greater than said first potential difference, in said first bit line pair.

11. A semiconductor memory device comprising:
first and second bit line pairs provided to each column where a plurality of memory cells are arranged;
a write circuit driving said first bit line pair when writing data to said memory cell; and
a sense amp for detecting the potential difference of said second bit line pair when reading data from said memory cell;
wherein the bit lines of said first bit line pair are disposed in parallel and the bit lines of said second bit line pair have a portion disposed in parallel and another portion which intersect at prescribed intervals.

12. A semiconductor memory device comprising:
first and second bit line pairs provided to each column where a plurality of memory cells are arranged;
a write circuit driving said first bit line pair when writing data to said memory cell;
a sense amp for detecting the potential difference of said second bit line pair when reading data from said memory cell,
wherein the bit lines of said second bit line pair are disposed in parallel and the bit lines of said first bit line pair are have a portion disposed in parallel and another portion which intersect at prescribed intervals.

13. The semiconductor memory device according to claim 11 or 12, wherein said memory cell comprises:

a latch circuit for storing data;

a first gate connected to said first bit line pair and becoming conductive by a control of a first word line; and a second gate connected to said second bit line pair and becoming conductive by a control of a second word line.

14. The semiconductor memory device according to claim 11 or 12, wherein said memory cell drives said second bit line pair during reading and generates a first potential difference in the second bit line pair; and wherein said write circuit drives said first bit line pair during writing and generates a second potential difference, greater than said first potential difference, in said first bit line pair.

15. The semiconductor memory device according to claims 1 through 8, 11 or 12, wherein three or more groups of said bit line pairs are formed.

* * * * *